(12) United States Patent
Toren et al.

(10) Patent No.: US 9,330,922 B2
(45) Date of Patent: May 3, 2016

(54) SELF-ALIGNED STACK GATE STRUCTURE FOR USE IN A NON-VOLATILE MEMORY ARRAY AND A METHOD OF FORMING SUCH STRUCTURE

(75) Inventors: Willem-Jan Toren, St. Maximin (FR); Xian Liu, Sunnyvale, CA (US); Gerhard Metzger-Brueckl, Geisenfeld (DE); Nhan Do, Saratoga, CA (US); Stephan Wege, Bannewitz-Cunnersdorf (DE); Nadia Miridi, Auriol (FR); Chien-Sheng Su, Saratoga, CA (US); Cecile Bernardi, Bouc Bel Air (FR); Liz Cuevas, Los Gatos, CA (US); Florence Guyot, Venellas (FR); Yueh-Hsin Chen, Pleasanton, CA (US); Henry Om'mani, Santa Clara, CA (US); Mandana Tadayoni, Cupertino, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 478 days.

(21) Appl. No.: 13/414,400

(22) Filed: Mar. 7, 2012

(65) Prior Publication Data
US 2013/0234223 A1 Sep. 12, 2013

(51) Int. Cl.
*H01L 29/788* (2006.01)
*H01L 21/28* (2006.01)
(Continued)

(52) U.S. Cl.
CPC .... *H01L 21/28273* (2013.01); *H01L 21/28282* (2013.01); *H01L 21/76283* (2013.01); *H01L 27/11521* (2013.01); *H01L 27/11568* (2013.01)

(58) Field of Classification Search
CPC ............... H01L 21/28273; H01L 27/11568; H01L 27/11521
USPC .............................. 257/316, E29.3, 314, 319
See application file for complete search history.

(56) References Cited

U.S. PATENT DOCUMENTS 6,746,918 B2 6/2004 Wu
7,829,412 B2 * 11/2010 Shin ...................... H01L 27/115
257/E21.679

(Continued)

FOREIGN PATENT DOCUMENTS

FR 2917533 A1 11/2007
KR 20070097659 10/2007

(Continued)

OTHER PUBLICATIONS

PCT Search Report and Written Opinion dated Apr. 8, 2013 corresponding to the related PCT Patent Application No. U52013/24288.

(Continued)

*Primary Examiner* — Minchul Yang
(74) *Attorney, Agent, or Firm* — DLA Piper LLP

(57) ABSTRACT

A stack gate structure for a non-volatile memory array has a semiconductor substrate having a plurality of substantially parallel spaced apart active regions, with each active region having an axis in a first direction. A first insulating material is between each stack gate structure in the second direction perpendicular to the first direction. Each stack gate structure has a second insulating material over the active region, a charge holding gate over the second insulating material, a third insulating material over the charge holding gate, and a first portion of a control gate over the third insulating material. A second portion of the control gate is over the first portion of the control gate and over the first insulating material adjacent thereto and extending in the second direction. A fourth insulating material is over the second portion of the control gate.

10 Claims, 4 Drawing Sheets

(51) Int. Cl.
*H01L 27/115* (2006.01)
*H01L 21/762* (2006.01)

(56) References Cited

U.S. PATENT DOCUMENTS

| | | |
|---|---|---|
| 7,868,375 B2 | 1/2011 | Liu et al. |
| 7,956,406 B2 | 6/2011 | Yasuda |
| 7,999,304 B2 | 8/2011 | Ozawa et al. |
| 8,008,707 B2 | 8/2011 | Matsuo et al. |
| 2003/0143790 A1 | 7/2003 | Wu |
| 2005/0253182 A1 | 11/2005 | Hung et al. |
| 2008/0096351 A1 | 4/2008 | Kim et al. |
| 2008/0259687 A1 | 10/2008 | Specht et al. |
| 2012/0032253 A1* | 2/2012 | Akahori et al. ............... 257/324 |

FOREIGN PATENT DOCUMENTS

| | | |
|---|---|---|
| KR | 20080079617 | 9/2008 |
| TW | 277179 20071 | 3/2007 |

OTHER PUBLICATIONS

Korean Office Action dated Apr. 30, 2015 corresponding to the related Korean Patent Application No. 10-20147028236.

\* cited by examiner

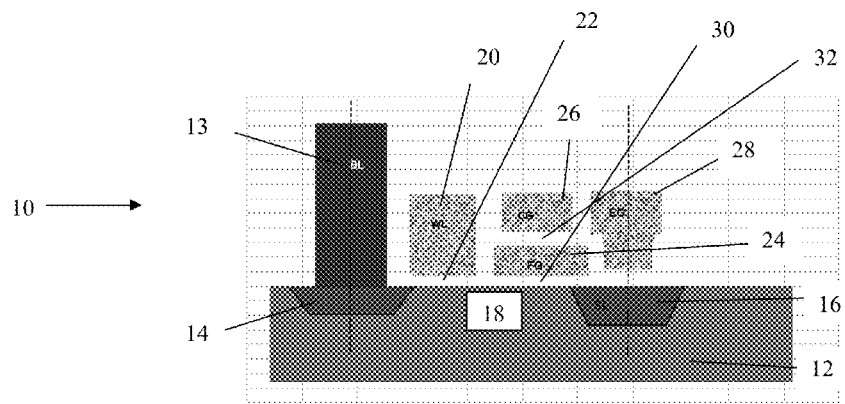
Figure 1 (Prior Art)
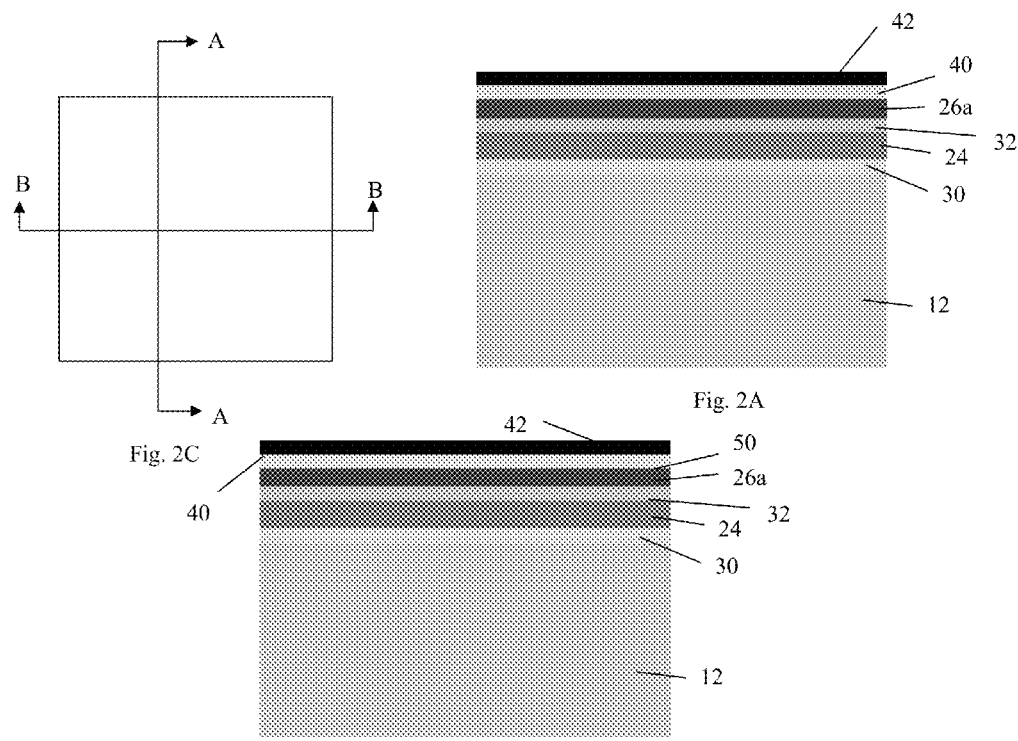
Fig. 2A
Fig. 2C
Fig. 2B

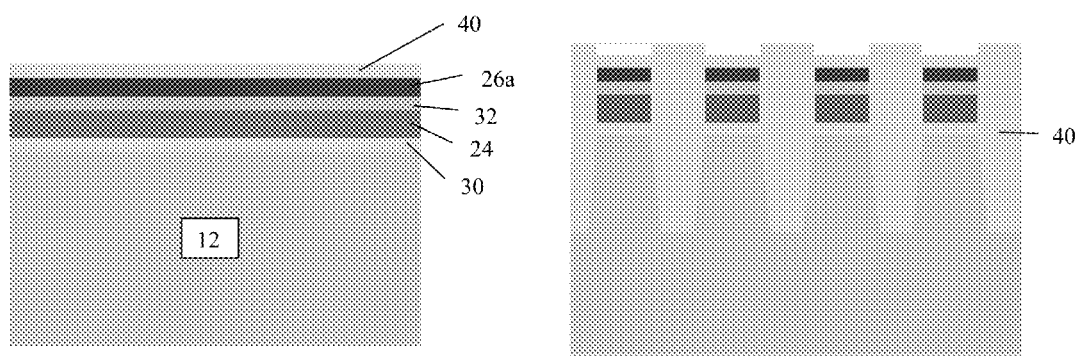
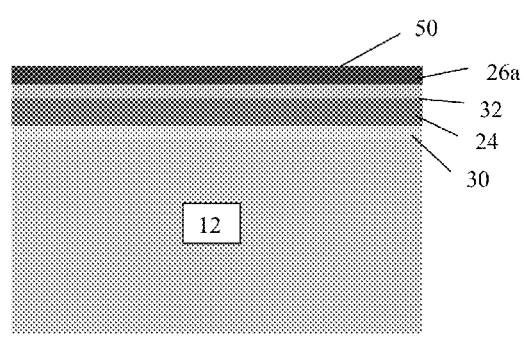
Fig. 4A
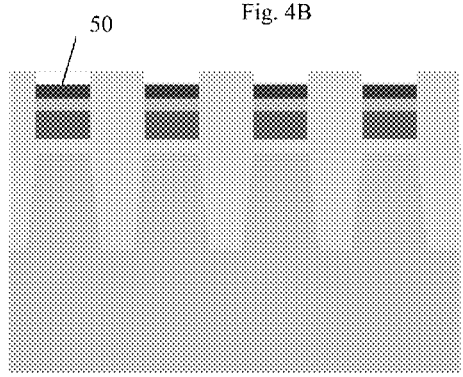
Fig. 4B
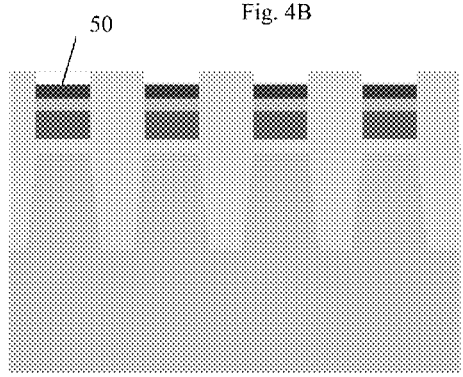
Fig. 5A
Fig. 5B-1
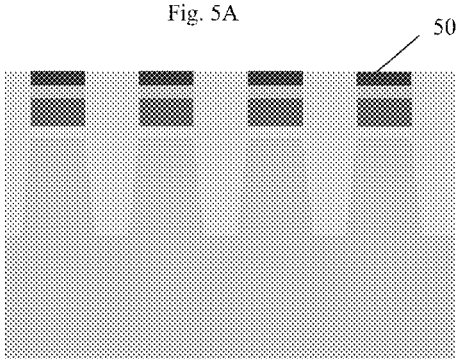
Fig. 5B-2

SELF-ALIGNED STACK GATE STRUCTURE FOR USE IN A NON-VOLATILE MEMORY ARRAY AND A METHOD OF FORMING SUCH STRUCTURE

TECHNICAL FIELD

The present invention relates to a stack gate structure that can be used in a non-volatile memory array, and a method of making same.

BACKGROUND OF THE INVENTION

Non-volatile memory cells having a floating gate or a trapping charge layer for the storage of charges thereon, in a stack gate structure are well known in the art. Referring to FIG. 1 there is shown a cross-sectional view of a non-volatile memory cell 10 of the prior art. The memory cell 10 comprises a single crystalline substrate 12, of a first conductivity type, such as P type. At or near a surface of the substrate 12 is a first region 14 of a second conductivity type, such as N type. Spaced apart from the first region 14 is a second region 16 also of the second conductivity type. Between the first region 14 and the second region 16 is a channel region 18. A word line 20, made of polysilicon is positioned over a first portion of the channel region 18. The word line 20 is spaced apart from the channel region 18 by an insulating layer 22, such as silicon (di)oxide. Immediately adjacent to and spaced apart from the word line 20 is a floating gate 24, which is also made of polysilicon, and is positioned over another portion of the channel region 18. The floating gate 24 is separated from the channel region 18 by another insulating layer 30, typically also of silicon (di)oxide. A coupling gate 26, also made of polysilicon is positioned over the floating gate 24 and is insulated therefrom by another insulating layer 32. On another side of the floating gate 24, and spaced apart therefrom, is an erase gate 28, also made of polysilicon. The erase gate 28 is positioned over the second region 16 and is insulated therefrom. The erase gate 28 is adjacent to and spaced apart from the coupling gate 26. The erase gate 28 can have a slight overhang over the floating gate 24. In the operation of the memory cell 10, charge stored on the floating gate 24 controls the flow of current between the first region 14 and the second region 16. Where the floating gate 24 is negatively charged thereon, the memory cell is programmed. Where the floating gate 24 is positively charged thereon, the memory cell is erased. The memory cell 10 is fully disclosed in U.S. Pat. No. 7,868,375 whose disclosure is incorporated herein in its entirety by reference.

The insulating layer 30, the floating gate 24, another insulating layer 32 and the coupling gate 26 form a stack gate structure. A stack gate structure can be used in a number of non-volatile memory cells: These include NAND type non-volatile memory which consists of a string of select transistors and stack gate transistors connected in series; NOR type non-volatile memory which consists of a select transistor and a stack gate transistor connected in series (2-T cell); NOR type non-volatile memory which consists of a select gate placed adjacent to a stack gate (split-gate cell); and finally NOR type non-volatile memory which consists of a single stack gate transistor (1-T cell).

SUMMARY OF THE INVENTION

The present invention is a stack gate structure for use in a non-volatile memory array. A semiconductor substrate has a plurality of substantially parallel spaced apart active regions, with each active region having an axis in a first direction. A plurality of stack gate structures are on the substrate with each stack gate structure over an active region, with a first insulating material between each stack gate structure in a second direction perpendicular to the first direction. Each stack gate structure comprises a second insulating material over the active region, a charge holding gate over the second insulating material, a third insulating material over the charge holding gate, and a first portion of a control gate over the third insulating material. A second portion of the control gate is over the top surface of the first portion of the control gate and over the top surface of the first insulating material adjacent thereto extending in the second direction. A fourth insulating material is over the second portion of the control gate.

The present invention is also a method of making the foregoing structure.

BRIEF DESCRIPTION OF THE DRAWINGS

FIG. 1 is a cross-sectional view of a non-volatile memory cell of the prior art having a stack gate structure.

FIG. 2A is a cross sectional view taken along the lines A-A in FIG. 2C, showing the first steps in the method of the present invention to make the stack gate structure of the present invention; FIG. 2B is a cross sectional view taken along the lines B-B in FIG. 2C showing the first steps in the method of the present invention to make the stack gate structure of the present invention; with FIG. 2C a top view of a structure formed on a semiconductor substrate using the first steps method of the present invention.

FIG. 4A and FIG. 4B are cross-section views taken along the lines A-A and B-B of FIG. 3C, showing the next steps in the formation of the stack gate structure of the present invention.

FIG. 5A and FIG. 5B-1 or 5B-2 are cross-section views taken along the lines A-A and B-B of FIG. 3C, showing the next steps in the formation of the stack gate structure of the present invention.

DETAILED DESCRIPTION OF THE PREFERRED EMBODIMENT

Figure 3C:
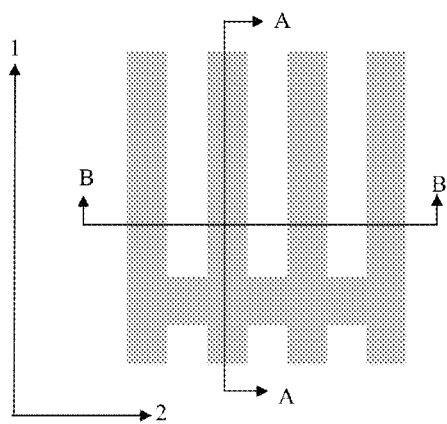
FIG. 3A is a cross sectional view taken along the lines A-A in FIG. 3C showing the next steps in the method of the present invention to make the stack gate structure of the present invention.
FIG. 3B is a cross sectional view taken along the lines B-B in FIG. 3C showing the next steps in the method of the present invention to make the stack gate structure of the present invention; with FIG. 3C a top view of a structure formed on a semiconductor substrate using the method of the present invention, after the steps shown in FIG. 2.

Referring to FIG. 2C there is shown a top view of a semiconductor substrate 12 processed in accordance with the first steps in the method of the present invention. FIG. 2A is a cross-sectional view taken along the lines A-A with FIG. 2B being a cross-section view taken along the lines B-B, generally perpendicular to the lines A-A of FIG. 2C. Because the method of the present invention will result in a structure of the present invention having parts similar to the cell 10 shown in FIG. 1, like parts will be designated with like numerals.

The semiconductor substrate 12 is generally of a P conductivity type. A first layer of silicon dioxide 30 of approximately 80-120 angstroms in thickness is formed on the semiconductor substrate 12. This can be done by thermal oxidation or deposition. A first layer of polysilicon 24 of approximately 200-500 angstroms in thickness is formed on the first layer of silicon dioxide 30. This can be done by deposition. The first layer of polysilicon 24 acts as a charge holding layer. The first layer of polysilicon 24 will eventually act as the floating gate. However, it is within the scope of the present invention, that the layer of polysilicon 24 can be replaced by a layer of charge trapping material, such as silicon nitride as a charge holding layer.

A first layer of composite insulating material 32 of approximately 100-200 angstroms in thickness is formed on the first layer of polysilicon 24. The layer of composite insulating material 32 can be silicon dioxide, silicon nitride, and silicon dioxide. Alternatively, the layer of composite insulating material 32 can be any insulating material including but not limited to silicon dioxide and/or silicon nitride. The layer of composite insulating material 32 can be formed by deposition, or a combination of deposition and oxidation.

A second layer of polysilicon 26a, of approximately 200-400 angstroms in thickness is formed on the composite insulating material 32. The second layer of polysilicon 26a eventually forms a first portion of the control gate 26. The second layer of polysilicon 26a can be formed by deposition. The second layer of polysilicon 26a has a top surface 50.

Another layer of insulating material 40, such as silicon dioxide, is formed on the top surface 50 of the second layer of polysilicon 26a. The insulating material 40 is of approximately 100-400 angstroms in thickness and can be formed by deposition.

A layer of silicon nitride 42 is then formed on the layer of insulating material 40. The layer of silicon nitride 42, as will be seen is a sacrificial layer. It can be of approximately 500-1000 angstroms in thickness and can be formed by deposition. As it is a sacrificial layer, it can also be made of other material(s). The resultant structure is shown in FIGS. 2A and 2B.

The structure shown in FIGS. 2A and 2B is subject to an etching step in which a plurality of substantially parallel, spaced apart regions are etched into the structure and into the semiconductor substrate 12, as show in FIG. 3C. The etched regions are then filled with an insulation material 40 such as silicon dioxide. As a result, the stack of materials shown in FIGS. 2A and 2B is positioned over each region in the semiconductor substrate 12, which is not etched, and form the active regions and extends in the direction shown by the arrow 1. The active regions in the substrate 12 are isolated from one another by the trench in the semiconductor substrate 12 filled with silicon dioxide 40. Adjacent active regions are separated from one another by the silicon dioxide 40 in the trench in the substrate 12 between the active regions in the direction shown by arrow 2. Furthermore, extending above the surface of the semiconductor substrate 12 the stack of materials (shown in FIGS. 2A and 2B) are also separated from one another by the trench filled silicon dioxide 40, in the direction of 2.

Figure 3B:
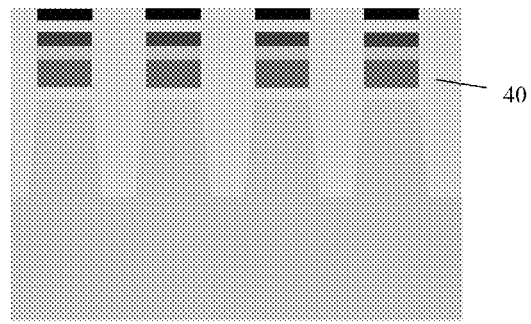
Figure 3A:
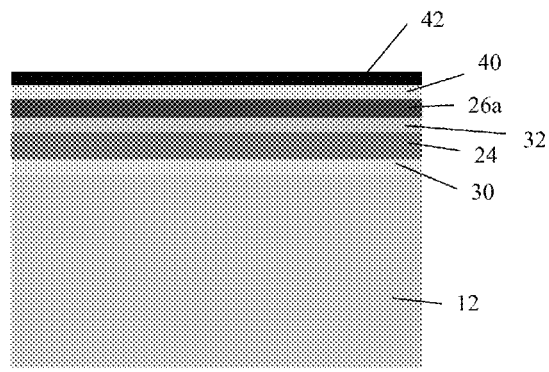

With the deposition of the silicon dioxide 40 in the trenches between the structures which are over the active regions of the substrate 12, some of the silicon dioxide 40 may be deposited on the top surface of the silicon nitride 42. A planarization step is then performed. This can be done for example by the use of CMP (Chemical Mechanical Polishing) and the silicon dioxide 40 is removed until the top surface of the silicon dioxide 40 in the trench is level with the top surface of the silicon nitride 42. The resultant structure is shown in FIGS. 3A and 3B.

The layer of silicon nitride 42 is then removed resulting in the structure shown in FIGS. 4A and 4B. The silicon nitride 42 can be removed by a wet etch.

The structure shown in FIGS. 4A and 4B is then subject to an etch back step in which the silicon dioxide material 40 over the top surface 50 of the first portion of the control gate 26a and over the adjacent isolation trench is removed. The etch back step can be done by an anisotropic etch process, such as RIE etch process. The etch back is sustained until the top surface 50 of the polysilicon 26a is exposed, i.e. all or substantially all of the silicon dioxide 40 on the top surface 50 of the control gate 26a is removed. The resultant structure is shown in FIGS. 5A and 5B-1. Because initially the "height" of the silicon dioxide 40 over the trench region is higher than over the control gate 26a, immediately after the top surface 50 of the control gate 26a is exposed, the height of the silicon dioxide 40 over the trench would still be taller than over the control gate 26a. However, if desired, the RIE etch process, which is selective to only silicon dioxide 40 can continue. In that case, the polysilicon 26a forming the control gate 26a, would remain unetched, while the silicon dioxide 40 over the isolation region or trench would continue to be etched. This etch process can continue until the top surface of the silicon dioxide 40 over the trench is substantially co-planar with the top surface 50 of the polysilicon 26a. The resultant structure is shown in FIG. 5B-2. For convenience of discussion purpose, it shall be assumed that the structure shown in FIG. 5B-2 is formed.

A second layer of polysilicon 26b is then formed on the structure of FIG. 5B-2. This can be formed to approximately 400-1000 angstroms thick by deposition. A layer of another composite material 52 is then formed on the second layer of polysilicon 26b. The second layer of composite material 52 can be silicon nitride-silicon dioxide and silicon nitride (NON). The second layer of composite material 52 can be formed by deposition, forming a thickness of approximately 1000-2000 angstroms. The resultant structure is shown in FIGS. 6A and 6B.

Figure 6A:
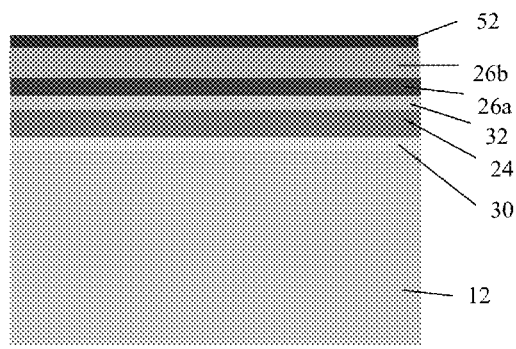
FIG. 6A and FIG. 6B are cross-section views taken along the lines A-A and B-B of FIG. 3C, showing the next steps in the formation of the stack gate structure of the present invention.
Figure 6B:
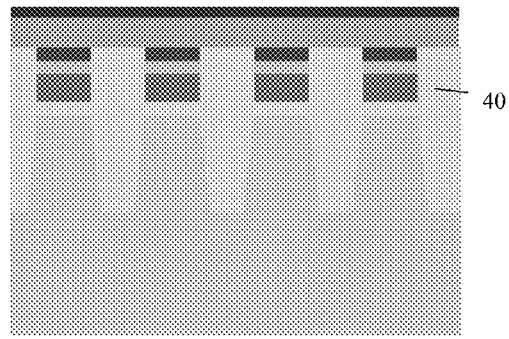
Figure 7A:
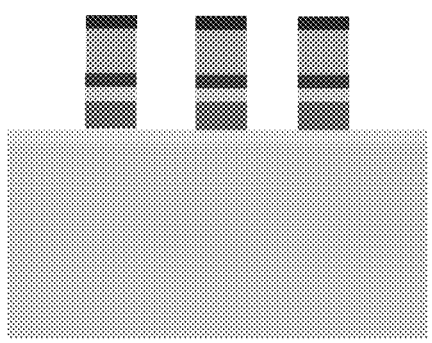
FIG. 7A and FIG. 7B are mutually orthogonal cross-section views, taken along the lines A-A and B-B of FIG. 7C, showing the final steps in the formation of the stack gate structure of the present invention.
Figure 7B:
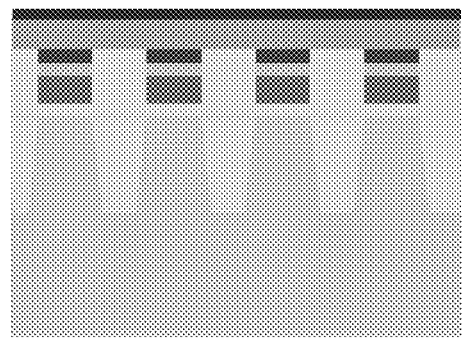
Figure 7C:
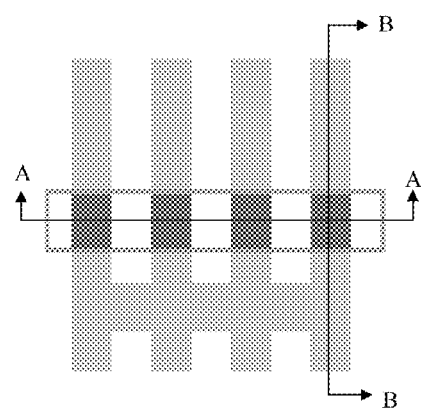

The structure shown in FIGS. 6A and 6B is then subject to an etch in the direction shown by the arrow 2 until the first layer 30 of silicon dioxide is reached. As a result standalone, spaced apart stack gate structures are formed, with each gate structure connected by the second polysilicon 26b in the direction shown by the arrow 2. The resultant structure is shown in FIGS. 7A and 7B which are mutually orthogonal cross-section views taken along the lines A-A and B-B respectively of the top view of the structure of the present invention shown in FIG. 7C.

From the foregoing, it can be seen that a planarized self-aligned connected plurality of stack gate structures are formed on a semiconductor substrate by the method of the present invention.

What is claimed is:
1. A stack gate structure for use in a non-volatile memory array comprising:
a semiconductor substrate having a plurality of substantially parallel spaced apart active regions, with each active region having an axis in a first direction;
a plurality of stack gate structures, each stack gate structure over an active region, with a first insulating material between each stack gate structure in a second direction perpendicular to the first direction; each stack gate structure comprising:

a second insulating material over the active region;
a charge holding gate over the second insulating material;
a third insulating material over the charge holding gate;
a first portion of a control gate over the third insulating material;
a second portion of the control gate over the top surface of the first portion of the control gate and over the top surface of the first insulating material adjacent thereto extending in the second direction; and
a fourth insulating material over the second portion of the control gate;
wherein said first portion of the control gate is polysilicon and has a top surface that is substantially co-planar with the top surface of the first insulating material adjacent thereto; and
a plurality of isolation regions in the semiconductor substrate, with each isolation region between a pair of the active regions, wherein each isolation region comprises:
a trench formed into the substrate, wherein one of the first insulating material extends down into and fills the trench.

2. The stack gate structure of claim 1 wherein said first insulating material is silicon oxide.

3. The stack gate structure of claim 2 wherein said second insulating material is silicon dioxide.

4. The stack gate structure of claim 1, wherein said charge holding gate is a floating gate.

5. The stack gate structure of claim 4 wherein said floating gate is made of polysilicon.

6. The stack gate structure of claim 1 wherein said charge holding gate is a charge trapping layer.

7. The stack gate structure of claim 6 wherein said charge trapping layer is silicon nitride.

8. The stack gate structure of claim 1 wherein said third insulating material is a composite insulator of silicon dioxide, silicon nitride, and silicon dioxide.

9. The stack gate structure of claim 1 wherein said second portion of the control gate is polysilicon.

10. The stack gate structure of claim 1 wherein said fourth insulating material is a composite insulating layer of silicon nitride, silicon dioxide and silicon nitride.

* * * * *